US007670189B1

(12) United States Patent  (10) Patent No.: US 7,670,189 B1
Culpepper et al.  (45) Date of Patent: Mar. 2, 2010

(54) EXTEND AND FLIP CONNECTOR

(75) Inventors: Stephen Culpepper, Sharpsburg, GA (US); Jack Martin, Jr., Cumming, GA (US)

(73) Assignee: AT&T Intellectual Property I, L.P., Reno, NV (US)

( * ) Notice: Subject to any disclaimer, the term of this patent is extended or adjusted under 35 U.S.C. 154(b) by 212 days.

(21) Appl. No.: 11/860,745

(22) Filed: Sep. 25, 2007

(51) Int. Cl.
*H01R 25/00* (2006.01)

(52) U.S. Cl. .................................. 439/638; 439/464

(58) Field of Classification Search ................. 439/638, 439/464
See application file for complete search history.

(56) References Cited

U.S. PATENT DOCUMENTS 4,227,764 A * 10/1980 Fiske ......................... 439/367

7,384,312 B2 * 6/2008 Van Der Mee et al. .. 439/607.44

* cited by examiner

*Primary Examiner*—Tho D Ta
(74) *Attorney, Agent, or Firm*—Scott P. Zimmerman PLLC

(57) ABSTRACT

Various connector devices are respectively equipped so that an electrical cable having a substantially right-angle cable head can be electrically coupled to an electronic apparatus by way of a suitable connector device. In turn, the electrical cable can be routed substantially tangentially away from the electronic apparatus in a predetermined direction. The connector devices also provide standoff distances that enable the dressing of electrical cables away from an apparatus having crowded connector sites. In this way, numerous cables can be routed away from an apparatus along a common direction and without mechanical interference with one another.

3 Claims, 2 Drawing Sheets

EXTEND AND FLIP CONNECTOR

BACKGROUND

Various types of electrical cabling are used to couple signals and/or power between electrical and/or electronic devices. It is common for an electronic apparatus (e.g., computer, router, disk array, etc.) to have several cables of various signal carrying capacities and connector types connected thereto, often at the rear side (or backplane) of the apparatus. These cables are typically routed away in various directions toward their respective destinations. Numerous cables include cable heads mounted at right angles (90 degrees) with respect to the cable itself in order to accommodate minimal space situations and/or routing of the cable in a desired direction.

However, a problem sometimes arises when several right-angle cables are connected to an electrical entity in close proximity to each other. If many (or all) of the cables are to be routed tangentially away from the entity in the same general direction, then conflicts can result from the crowded conditions. Specifically, the connection of one right-angle cable head to the electrical entity precludes the connection of another cable head at a closely adjacent site.

Furthermore, many electronic apparatus are presently configured such that several different cable types are required to be connected to the apparatus. Such cable and connector diversity results in inventory problems and additional expense.

SUMMARY

This summary is provided to introduce general concepts of connector devices, which are further described below in the Detailed Description. This summary is not intended to identify essential features of the claimed subject matter, nor is it intended to limit the scope of the claimed subject matter.

In one aspect, an apparatus includes a housing and a first electrical connector that is supported by the housing. The apparatus also includes a second electrical connector that is supported by the housing. The second electrical connector is electrically coupled to the first electrical connector. Also, the first and second electrical connectors are fixedly disposed in a rotationally inverted relationship to each other. Furthermore, the first and second electrical connectors are fixedly disposed on opposite sides of the housing.

In another aspect, a connector device includes a housing and a first electrical connector. The first electrical connector is supported by the housing and includes a plurality of electrical connection nodes. The connector device also includes a second electrical connector that is supported by the housing. The second electrical connector includes a plurality of electrical connection nodes that are electrically coupled, in one-to-one correspondence, to the plurality of electrical connection nodes of the first electrical connector. The first electrical connector is fixedly disposed in a rotationally inverted relationship with respect to the second electrical connector.

In yet another aspect, a method includes providing a connector device and an electronic entity and an electrical cable. The electrical cable including a cable head disposed at about a ninety degree angle with respect to the electrical cable. The method includes matably electrically coupling the connector device to an electrical connection of the electronic entity. The method further includes matably electrically coupling the cable head to the connector device such that the electrical cable extends tangentially away from the cable head in a predetermined direction. The cable head is rotationally inverted with respect to the electrical connection of the electronic entity by virtue of the connector device.

BRIEF DESCRIPTION OF THE DRAWINGS

The detailed description is set forth with reference to the accompanying figures. The use of the same reference numbers in different figures indicates similar or identical items.

DETAILED DESCRIPTION

Overview

This disclosure is directed to connector devices suitable for use with a variety of electrical and electronic apparatus. The connector devices enable the coupling of right-angle cables to electrical apparatus such that the cables may be routed or "dressed" away from the apparatus in a desired direction. In this way, numerous cables can be accommodated in a densely populated backplane environment while permitting a common direction of routing for all such cables. Furthermore, the connector devices may enable standardization around a single right-angle cable configuration with respect to the electrical or electronic apparatus being served. In other implementations, however, multiple different cable configurations may be used.

Illustrative Connector Devices

Figure 1:
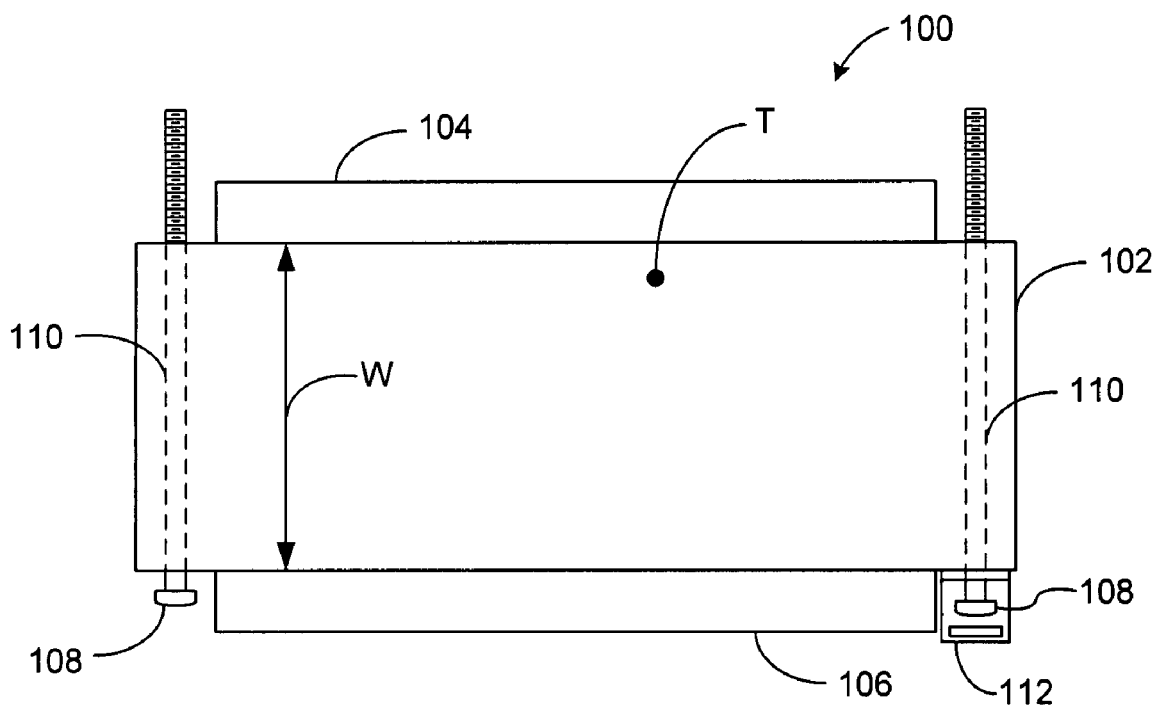
FIG. 1 is a plan view depicting an illustrative connector device.

FIG. 1 illustrates plan view depicting an illustrative connector device 100. As depicted, the reader is looking down onto a top surface "T" of the connector device 100. The connector device 100 includes a housing 102. The housing 102 can be formed of any suitable material such as, for example, plastic or aluminum. The housing 102 is defined by a width or standoff distance "W".

The connector device 100 includes an electrical connector 104 and an electrical connector 106. The electrical connectors 104 and 106 are fixedly supported by the housing 102 and separated from each other by the distance W. Thus, according to exemplary embodiments, the electrical connectors 104 and 106 are respectively disposed on opposite ends of the connector device 100 and face outward away from the housing 102. Each of the connectors 104 and 106 is configured to be electrically coupled to a suitable external entity such as, for example, a signal cable or an electronic apparatus (e.g., a computer, data acquisition instrumentation, a modem, a communications switch, a server). Such coupling is discussed in further detail hereinafter.

The connector device 100 of FIG. 1 also includes a pair of machine screws 108. Each of the machine screws 108 is supported by way of a respective through passageway 110 defined by the housing 102. The machine screws 108 are configured to enable mechanical securing of the connector device 100 to a connector of an electronic apparatus such as, for example, a signal router, a computer, data acquisition or control instrumentation, or telecommunications equipment. In one embodiment, the machine screws 108 are defined by standard 4-40 machine screws. Other suitable machine screws 108 can also be used. In another embodiment, another count of machine screws is used to secure the connector device to an electronic apparatus. In yet another embodiment, other suitable mechanical means (e.g., latches, cap screws, snap connectors, etc.) can be used to secure the connector device to an electronic entity.

According to exemplary embodiments, the connector device 100 further includes a bracket 112. The bracket 112 is configured to enable mechanical securing of a cable head or other entity to the connector device 100 by way of a strap-like arrangement. Such a strap-like arrangement can be defined, for example, by a nylon cable tie, waxed cotton string, flexible plastic strip, wire, rubber strap, or any other suitable construct. The bracket 112 may be supported by one of the machine screws 108 of the connector device 100. Further details regarding the bracket 112 are discussed below in accordance with FIG. 4.

Figure 2:
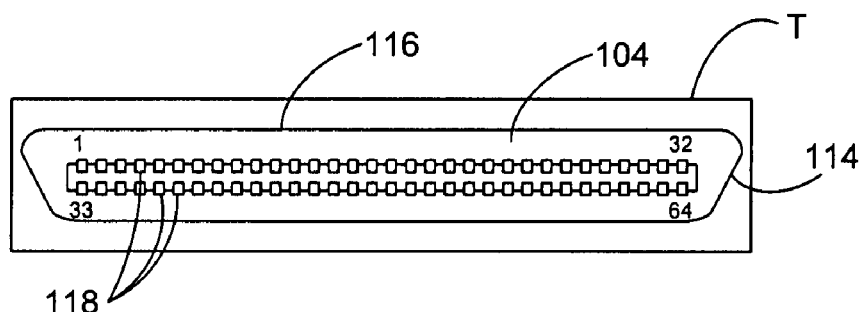
FIG. 2 is an end elevation view depicting select details of the connector device of FIG. 1.

FIG. 2 is an end elevation view of one possible embodiment of the electrical connector 104 of the connector device 100 of FIG. 1. As depicted in FIG. 2, the electrical connector 104 is a sixty-four pin male Amphenol® "Amp Champ" connector available from Amphenol Corporation, Wallingford, Conn., USA 06492-7530. Thus, the electrical connector 104 of FIG. 2 has a total of sixty-four discrete electrical connector pins or nodes 118 available for routing electrical signals and/or power. The electrical connector 104 includes a hood (i.e., cowling) 114 that is defined by a substantially D-shaped cross-sectional form having a top edge 116. The electrical connector 104 is fixedly supported such that the top edge 116 is adjacent to the top surface T of the connector device 100. The electrical connector 104 is illustrative of any number of suitable electrical connectors that can be used in corresponding embodiments of the connector device 100.

Figure 3:
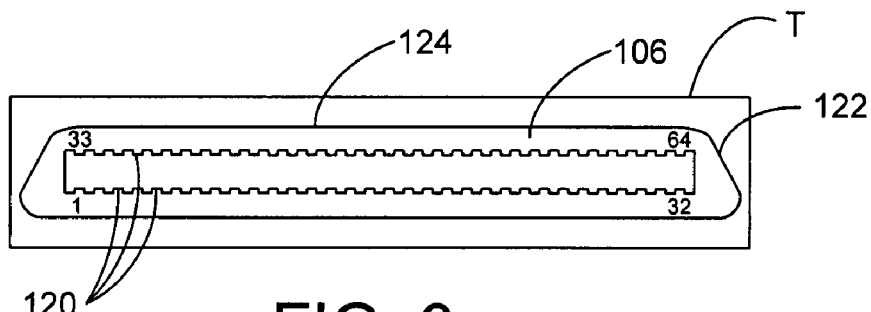
FIG. 3 is an end elevation view depicting other select details of the connector device of FIG. 1.

FIG. 3 is an end elevation view of one possible embodiment of the electrical connector 106 of the connector device 100 of FIG. 1. As depicted in FIG. 3, the electrical connector 106 is a sixty-four pin female Amphenol® "Amp Champ" connector available from Amphenol Corporation as cited above. Thus, the electrical connector 106 of FIG. 3 has a total of sixty-four discrete electrical connector pins or nodes 120 available for routing electrical signals and/or power. The electrical connector 106 includes a hood 122 defined by a substantially D-shaped cross-sectional form having a top edge 124. The electrical connector 106 is fixedly supported such that the top edge 124 is adjacent to the top surface T of the connector device 100. The electrical connector 106 is illustrative of any number of suitable electrical connectors having any respective number of electrical connector pins or nodes that can be used in corresponding embodiments of the connector device 100. In one or more embodiments of the connector device 100, the hoods 114 and 122 are metallic and are electrically interconnected to one another. Other embodiments of connector device including metallic and/or non-metallic hoods 114 and/or 122, which are electrically connected or isolated, respectively, can also be used.

According to exemplary embodiments, the electrical connector pins 118 of the electrical connector 104 of FIG. 2 are electrically connected in one-to-one correspondence to the electrical connector pins 120 of the electrical connector 106 of FIG. 3. That is, a pre-designated "pin one" of the connector 104 of FIG. 2 is electrically connected to a counterpart "pin one" of the connector 106 of FIG. 3, and so on, for a total of sixty-four discrete and isolated pin-to-pin interconnections. These electrical pin interconnections are supported and protected within the housing 102 of the connector device 100. In this regard, the connector device 100 of FIG. 1 can be thought of as a direct pass-through signal coupler between an electronic apparatus (e.g., router, instrumentation, etc.) and a corresponding cable.

According to exemplary embodiments, the electrical connectors 104 and 106 are respectively fixed to the housing 102 such that the electrical connector 104 is rotationally inverted (i.e., flipped, or "upside down") with respect to the electrical connector 106. The connector device 100 of FIG. 1 is therefore useful in situations where right-angle cables are to be routed in a common direction away from an apparatus having connectors mounted in two different rotational orientations.

Figure 2A:
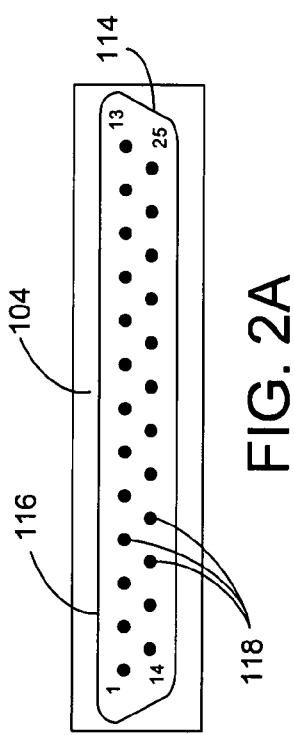
FIG. 2A is an end elevation view depicting select details of an alternative embodiment of the connector device of FIG. 1.
Figure 3A:
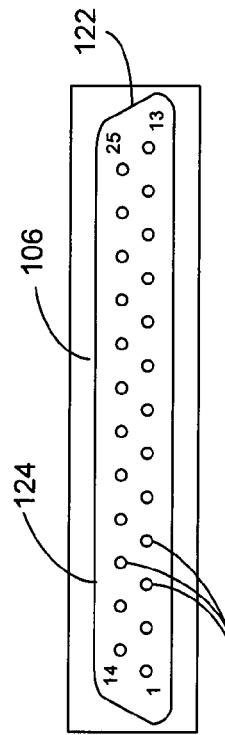
FIG. 3A is an end elevation view depicting select details of an alternative embodiment of the connector device of FIG. 1.

FIGS. 2A and 3A depict alternative electrical connectors 104 and 106, such as the electrical connectors 104 and 106, respectively, corresponding to another embodiment of the connector device 100 of FIG. 1. As depicted in FIG. 2A, the electrical connector 104 includes the substantially D-shaped cross-sectional form 114 having the top edge 116. The connector 104 of FIG. 2A includes twenty-five of the male electrical connection pins 118. In another embodiment (not shown), another suitable number of the connection pins 118 can be used (e.g., nine, fifteen, etc.).

The electrical connector 106 of FIG. 3A includes the substantially D-shaped cross-sectional form 122 having the top edge 124. The electrical connector 106 of FIG. 3A includes twenty-five of the female electrical connection pins 120. The pins 118 of the electrical connector 104 of FIG. 2A are electrically interconnected in one-to-one correspondence to the pins 120 of the electrical connector 106 of FIG. 3A for a total of twenty-five discrete and isolated pin-to-pin interconnections. The electrical connectors 104 and 106 of FIGS. 2A and 3A are fixedly supported by the housing 102 of FIG. 1 in rotationally inverted relationship to one another.

While the respective electrical connector nodes 118 and 120 of the electrical connectors 104 and 106 (of FIGS. 2, 2A, 3 and 3A) are referred to as "pins", it is to be understood that any suitable form of electrical connector node can be used such as, for example, a metallic tab, a folded metal strip, a metal rod or lance-like protrusion, a metallic socket or cavity, etc. Thus, the term "pin" as used herein is broadly applicable to a variety of suitable geometric forms configured to make electrically conductive contact with another corresponding connector entity.

As described above, the connector device 100 of FIG. 1 includes two interconnected electrical connectors 104 and 106 that are rotationally inverted (i.e., flipped over) with respect to each other, according to exemplary embodiments. However, other embodiments of connector device (not shown) can include respective electrical connectors that are rotationally consistent with one another. Such embodiments can be used to extend or offset a cable head away from an electronic apparatus so as to accommodate numerous right-angle cables routed away from the apparatus in parallel and along a common direction.

Figure 4:
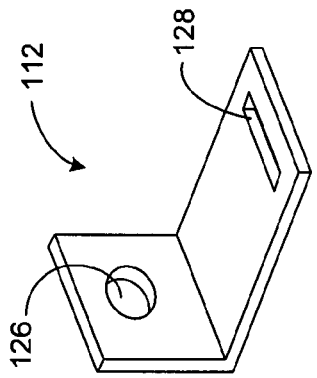
FIG. 4 is an isometric view depicting component details of the connector device of FIG. 1.

FIG. 4 is an isometric view depicting the bracket 112 of the connector device 100 of FIG. 1 in detail. The bracket 112 (FIG. 4) can be formed from any suitable material such as, for example, aluminum, brass, nylon, plastic, etc. According to exemplary embodiments, the bracket 112 includes a right-angle configuration and defines a through aperture 126 and a through aperture 128. The through aperture 126 enables the bracket 112 to be secured to the connector device 100 (FIG. 1) by way of one of the machine screws 108. In turn, the through aperture 128 (FIG. 4) enables a cable head or similar entity to be secured to the bracket 112 by way of, for example, a nylon cable tie, waxed cotton string, a hook-and-loop closure strap, flexible plastic strip, wire, rubber strap, or other suitable means.

Illustrative Usage Environment

Figure 5:
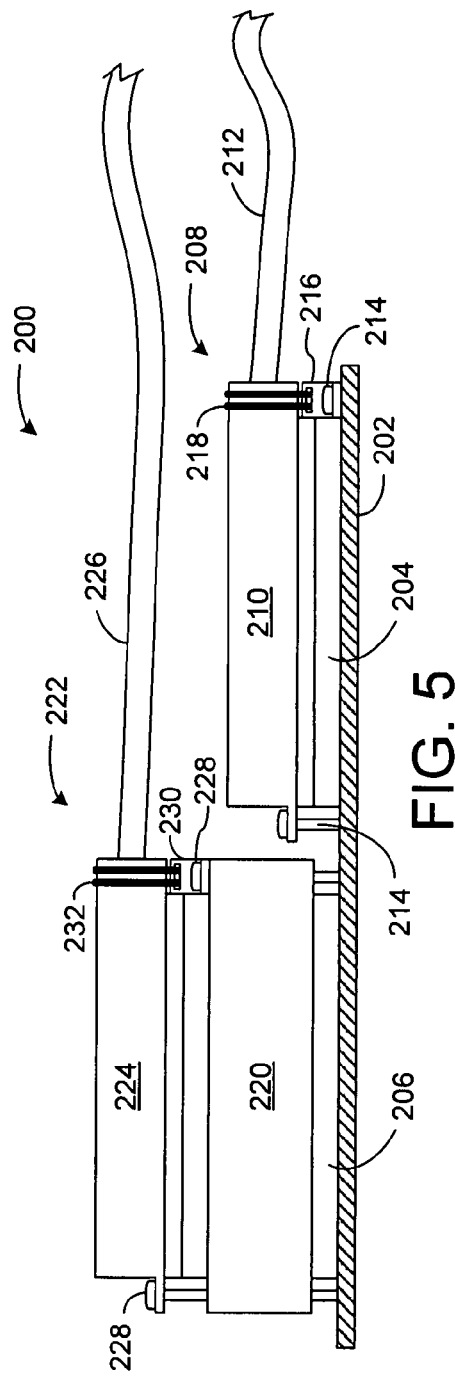
FIG. 5 is an elevation view of an illustrative usage environment according to one embodiment.

FIG. 5 is an elevation view of an illustrative usage environment 200 in accordance with the present disclosure. The environment 200 (FIG. 5) includes a backplane 202 supporting an electrical connector 204 and an electrical connector 206. For purposes of understanding, the backplane 202 and the electrical connectors 204 and 206 are presumed to be part of an electronic apparatus (e.g., computer, telecommunications switch, controls instrumentation, etc.).

The environment 200 includes a right-angle cable (cable) 208. The cable 208 includes a cable head 210 and a length of cable 212. The cable head 210 of the cable 208 is mated and electrically coupled to the electrical connector 204. Also, the cable head 210 is mechanically secured to the backplane 202 by way of machine screws 214, bracket 216 and a strapping 218. As depicted in FIG. 5, the cable 212 is routed tangentially (i.e., laterally) away from the backplane 202 toward the right.

The environment 200 of FIG. 5 also includes a connector device 220. For purposes of illustration, it is assumed that the connector device 220 is equivalent to the connector device 100 as described above in regard to FIGS. 1, 2 and 3. However, other embodiments of connector device 220 (FIG. 5) can also be used in accordance with varying usage scenarios. The connector device 220 is mated and electrically coupled to the electrical connector 206 of the backplane 202.

The environment 200 also includes a right-angle cable (cable) 222. The cable 222 includes a cable head 224 and a length of cable 226. The cable head 224 is mated and electrically coupled to the connector device 220. In turn, the connector device 220 and the cable head 224 are mutually mechanically secured to the backplane 202 by way of machine screws 228, a bracket 230 and a strapping (i.e., strap-like arrangement) 232. As depicted in FIG. 5, the cable 226 is routed substantially tangentially away from the backplane 202 toward the right. At least a portion of the cable 226 is substantially parallel to and generally overlies the cable 212. However, it is noted that there is little or no mechanical interference between the cable 212 and the cable 226 despite the relatively close proximity of the electrical connectors 204 and 206.

CONCLUSION

Although the disclosure has been made in language specific to structural features and/or methodological acts, it is to be understood that the disclosed concepts are not necessarily limited to the specific features or acts described. Rather, the specific features and acts are disclosed as exemplary implementations.

What is claimed is:

1. A method comprising:
    providing a connector device, an electronic entity, and a first electrical cable including a first cable head disposed at about a ninety degree angle with respect to the first electrical cable;
    providing a second electrical cable including a second cable head disposed at about a ninety degree angle with respect to the second electrical cable;
    electrically coupling the connector device to an electrical connection of the electronic entity;
    electrically coupling the first cable head to the connector device such that the first electrical cable extends substantially tangentially away from the electronic entity in a predetermined direction and the first cable head is rotationally inverted with respect to the electrical connection of the electronic entity by virtue of the connector device; and
    electrically coupling the second cable head to the electronic entity such that the second electrical cable extends tangentially away from the electronic entity in substantially the predetermined direction.

2. The method of claim 1 wherein at least a portion of the first electrical cable substantially parallels and substantially overlies at least a portion of the second electrical cable.

3. The method of claim 1, further comprising securing the cable head to the connector device by way of a bracket of the connector device and a strap.

\* \* \* \* \*